United States Patent
Chisholm et al.

(10) Patent No.: US 6,586,839 B2
(45) Date of Patent: Jul. 1, 2003

(54) APPROACH TO STRUCTURALLY REINFORCING THE MECHANICAL PERFORMANCE OF SILICON LEVEL INTERCONNECT LAYERS

(75) Inventors: Michael F. Chisholm, Garland, TX (US); Darvin R. Edwards, Garland, TX (US); Gregory B. Hotchkiss, Richardson, TX (US); Reynaldo Rincon, Richardson, TX (US); Viswanathan Sundararaman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/938,261

(22) Filed: Aug. 23, 2001

(65) Prior Publication Data

US 2002/0025417 A1 Feb. 28, 2002

Related U.S. Application Data

(60) Provisional application No. 60/229,408, filed on Aug. 31, 2000.

(51) Int. Cl.$^7$ .............................................. H01L 23/48
(52) U.S. Cl. ........................................ 257/773; 257/786
(58) Field of Search .............................. 428/209, 901; 257/773, 774, 776, 784, 786

(56) References Cited

U.S. PATENT DOCUMENTS

| | | | | |
|---|---|---|---|---|
| 5,539,247 A | * | 7/1996 | Cheung et al. | 257/758 |
| 6,011,311 A | * | 1/2000 | Hsing et al. | 257/774 |
| 6,078,088 A | * | 6/2000 | Buynoski | 257/410 |
| 6,083,822 A | * | 7/2000 | Lee | 438/624 |
| 6,207,553 B1 | * | 3/2001 | Buynoski et al. | 438/622 |
| 6,265,308 B1 | * | 7/2001 | Bronner et al. | 438/637 |

* cited by examiner

Primary Examiner—Cathy Lam
(74) Attorney, Agent, or Firm—Jacqueline J. Garner; W. James Brady, III; Frederick J. Telecky, Jr.

(57) ABSTRACT

A conductive via pattern (110) between the uppermost metal interconnect layer ($M_n$) and next underlying metal interconnect layer ($M_{n-1}$) in the bond pad areas strengthens the interlevel dielectric (ILD3) between metal layers ($M_n$ and $M_{n-1}$). The conductive via layer (110) may, for example, comprise parallel rails (114) or a grid of cross-hatch rails (116). By spreading the stress concentration laterally, the conductive via layer (110) inhibits micro-cracking from stress applied to the bond pad (112).

9 Claims, 3 Drawing Sheets

APPROACH TO STRUCTURALLY REINFORCING THE MECHANICAL PERFORMANCE OF SILICON LEVEL INTERCONNECT LAYERS

This application claims priority under 35 USC §119(e)(1) of provisional application No. 60/229,408 filed Aug. 31, 2000.

CROSS-REFERENCE TO RELATED APPLICATIONS

The following co-pending U.S. patent application is believed to be relevant: Ser. No. 08/847,239 filed Apr. 30, 1997 to Saran et al, now U.S. Pat. No. 6,143,396.

1. Field of the Invention

The invention is generally related to the field of integrated circuits and more specifically to improving the mechanical stability of interconnects under bond pads in an integrated circuit.

2. Background of the Invention

A well known problem area in semiconductor processing is the process of attaching a solder, wire or other bonding elements to a bond pad on a semiconductor integrated circuit. These bond pads are typically disposed above one or more layers or stacks of brittle and/or soft dielectric materials, typically oxides of silicon and some organic materials, for planarization and insulation purposes. Some dielectric materials, such as hydrogen silsesquioxane (HSQ), organo-silicate glass (OSG), aerogels, organic polyimides, parylenes, and others are advantageous for their low dielectric constants compared to silicon oxides, but are weaker structurally and mechanically.

During the bonding process, mechanical loading and ultrasonic stresses applied by the bonding capillary tip to the bond pad often result in fracture of the underlying dielectrics, deformation of the underlying metal structures, and delamination of the layers in the metal structures. These bonding failures may appear as craters in the bond pad and underlying layers as the bonding capillary tip is pulled away from the bonding pad. However, these defects often are not apparent during bonding but would manifest themselves during subsequent bond pull and shear tests, reliability tests such as thermal cycle or thermal shock, or upon deprocessing and cross-sectioning.

Further, weakness of the bond pad structure may also reveal itself during wafer probing prior to bonding. Again, the stresses exerted by the probe tips, typically formed of a hard metal such as tungsten and copper beryllium, can cause localized fractures in the pads, despite the fact that they make contact with softer metals such as aluminum and copper, on the bond pads. Such fractures are as much of a reliability hazard as those caused during bonding.

Traditionally, the bonding failures have been addressed by altering bonding parameters, such as ultrasonic power and pulse waveform, bonding temperature, bonding time, clamping force, shape of the bonding capillary tip, etc. Much time is spent experimenting with parameter settings and combinations thereof. Although general guidelines of parameter setpoints and configurations have been developed, the bonding failures persist at a sufficiently significant level to continually threaten the reliability of integrated circuit devices. Yet the failure levels are low such that bonding failures become apparent only after several tens of thousands of devices are bonded.

Recent technological advances in semiconductor processing do not alleviate the situation. New dielectric materials with lower dielectric constants are being used to increase circuit speeds but they are mechanically weaker than the conventional plasma enhanced chemical vapor deposition (CVD) dielectrics. Decreasing bond pad dimensions necessitates the increase of stresses due to the bonding process attributable to the use of ultrasonic energy to form effective bonds. Inaccessibility of higher bond parameter settings for fear of damage to the bond pads also results in longer bond formation time, and consequently, lost throughput. All these significant changes point to a trend of more severe failures and increase in their frequency.

SUMMARY OF THE INVENTION

The invention uses a conductive via pattern or group between the bond pad of the uppermost metal interconnect layer ($M_n$) and a metal pad on the next underlying metal interconnect layer ($M_{n-1}$). The conductive via pattern strengthens the interlevel dielectric (ILD) between $M_n$ and $M_{n-1}$. By spreading the stress concentration laterally, the conductive via pattern inhibits microcracking in the ILD from stress applied to the bond pad.

An advantage of the invention is providing an integrated circuit having reinforced interconnects to prevent microcracking during probing, wire bonding, or packaging.

This and other advantages will be apparent to those of ordinary skill in the art having reference to the specification in conjunction with the drawings.

DETAILED DESCRIPTION OF THE EMBODIMENTS

With the advancement of silicon technology in to newer process nodes, conventional probing and bonding techniques begin to create extensive mechanical damage in the form of micro-cracks under the bond pad areas. Micro-cracking can be more than a cosmetic problem. It can cause yield loss due to an electrical fail and/or affect device reliability. Micro-cracking in newer technologies is believed to be due to the use of a thinner top metal interconnect layer. In many cases, the thickness of the top metal interconnect is being reduced from around 6000 Å to 4500–5000 Å. These micro-cracks may result in significant yield loss after probe and/or wire bonding or flip-chip interconnect operations. The resulting level of yield loss and/or non-reliable products is expected to be 10–20%.

The problem is likely to be further compounded as low dielectric constant (low-k) materials are employed. The low-k materials are typically less mechanically durable. However, the low-k materials are needed to achieve higher device speeds and the desired miniaturization to maximize revenue per wafer. A low-k material is typically defined as a material with a dielectric constant less than 4.2.

Figure 1:
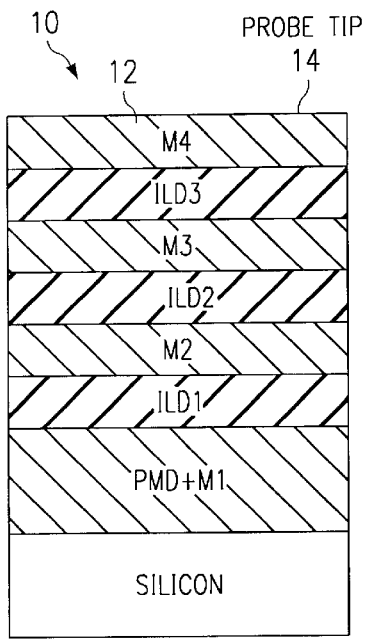
FIG. 1 is a cross-sectional diagram of a metal interconnect used to evaluate stresses.

FIG. 1 is a cross-sectional diagram of structure 10 used for evaluating stresses from a probe tip 14. Various metal interconnect layers (M2,M3,M4) are located under a bond pad area 12. The metal interconnect layers M2,M3, and M4 comprise copper. The intervening interlevel dielectrics (ILDs) are ILD1, ILD2, and ILD 3 respectively. ILD1, ILD2, and ILD3 comprise a low-k dielectric.

Figure 2:
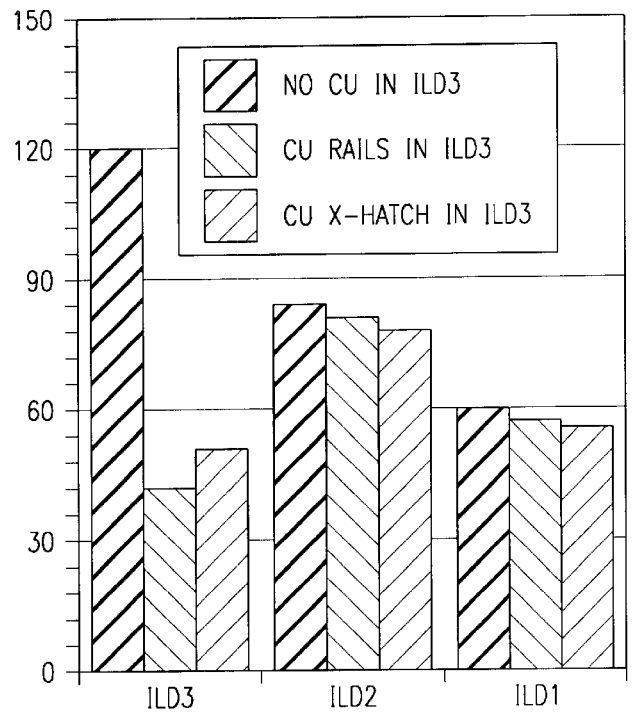
FIG. 2 is a graph of stresses for various ILD layers.

Numerical simulation of stress from a probe pin applied to the bondpads of various interconnects is illustrated in FIG. 2. Stress levels are indicated for the three ILD layers, ILD1, ILD2, and ILD3. The first case is for the structure 10 of FIG. 1. It shows significantly higher stress in ILD3. The second case is related to a first embodiment of the invention in which copper rails parallel to the direction of probing are included in a conductive via layer within ILD3. The third case is related to a second embodiment of the invention in which a copper cross-hatch via layer is included in ILD3. The via layer significantly reduces the stress in ILD3 and reduces to a lesser extent the stresses in ILD2.

Figure 3:
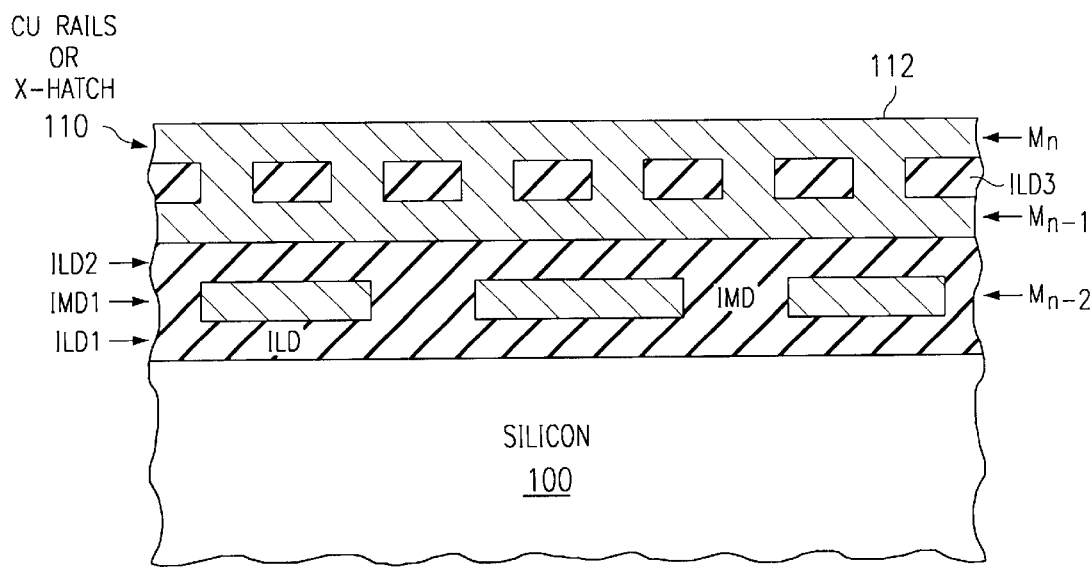
FIG. 3 is a cross-section diagram of a reinforced interconnect structure according to the invention.

In order to reduce stresses in the ILDs and prevent micro-cracking, the invention utilizes the via layer between metal layers n and n−1 to reinforce the areas under the bond pads. An embodiment of the invention is shown in FIG. 3. Metal interconnect layers are formed over a semiconductor body 100. Only the uppermost three metal interconnect layers, $M_n$, $M_{n-1}$, and $M_{n-2}$, are shown, the first metal interconnect layer, $M_1$, and any other metal interconnect layers not shown are incorporated into semiconductor body 100. Semiconductor body 100 typically comprises a substrate with isolation structures, transistors, and other devices formed therein (or thereover).

The metal interconnect layers $M_1$ through $M_n$ comprise copper with appropriate barrier materials in the preferred embodiment. The barrier material may, for example, comprise Ta, TaN, TaSiN or combinations thereof. Other appropriate barrier materials will be apparent to those of ordinary skill in the art having reference to this specification. Although the invention is particularly useful for copper interconnects, other metal interconnect materials, such as aluminum, may alternatively be used.

The top metal interconnect layer $M_n$ is used to form pad 112. Pad 112 may be either a bond pad or a probe pad, as $M_n$ is used to form both types of pads. $M_n$ is also used for standard interconnection. Although only one pad 112 is shown, many bond pads and probe pads are included in top metal interconnect layer $M_n$.

ILD1 is located between $M_{n-2}$ and the semiconductor body 100. IMD1 (a first intra-metal dielectric) is located between the leads of $M_{n-2}$. ILD2 is located between $M_{n-1}$ and $M_{n-2}$. ILD3 is located between $M_n$ and $M_{n-1}$. There are a variety of low-k interlevel dielectric materials currently under investigation. In the preferred embodiment, fluorine-doped silicate glass (FSG) is used for ILD1, ILD2, and ILD3. Alternatives include, but are not limited to, hydrogen silsesquioxane (HSQ), organo-silicate glass (OSG), aerogels, organic polyimides, and parylenes. While the invention is especially beneficial to low-k dielectrics that are mechanically weak, more traditional dielectrics, like PETEOS (plasma enhanced tetraethyoxysilane), may also be used.

Conductive via structures 110 are included within ILD3. Conductive via structures 110 structurally reinforce ILD3. Conductive via structures 110 comprise the same material normally used to provide via connections between $M_n$ and $M_{n-1}$. For dual damascene copper interconnects, the same barrier and copper are used for the vias as for the metal leads. Trenches are etched in IMD3 for the bond pads and vias are etched in the ILD3 for the conductive via structures 110. A barrier layer and a copper seed layer are deposited over the structure including in the vias and trenches. The trenches and vias are then filled with copper using an electroplating process. Chemical mechanical polishing (CMP) is then typically used to planarize the copper in the trenches with the surface of IMD3 (not shown-a third intra-metal dielectric).

Conductive via features 110 provide a mechanically superior and stiffer metal than the ILD by itself. The presence of the metal in conductive via structures 110 spreads the stress concentration laterally. By laterally spreading the stress concentration, conductive via structures 110 prevent micro-cracking in the ILDs.

Figure 4:
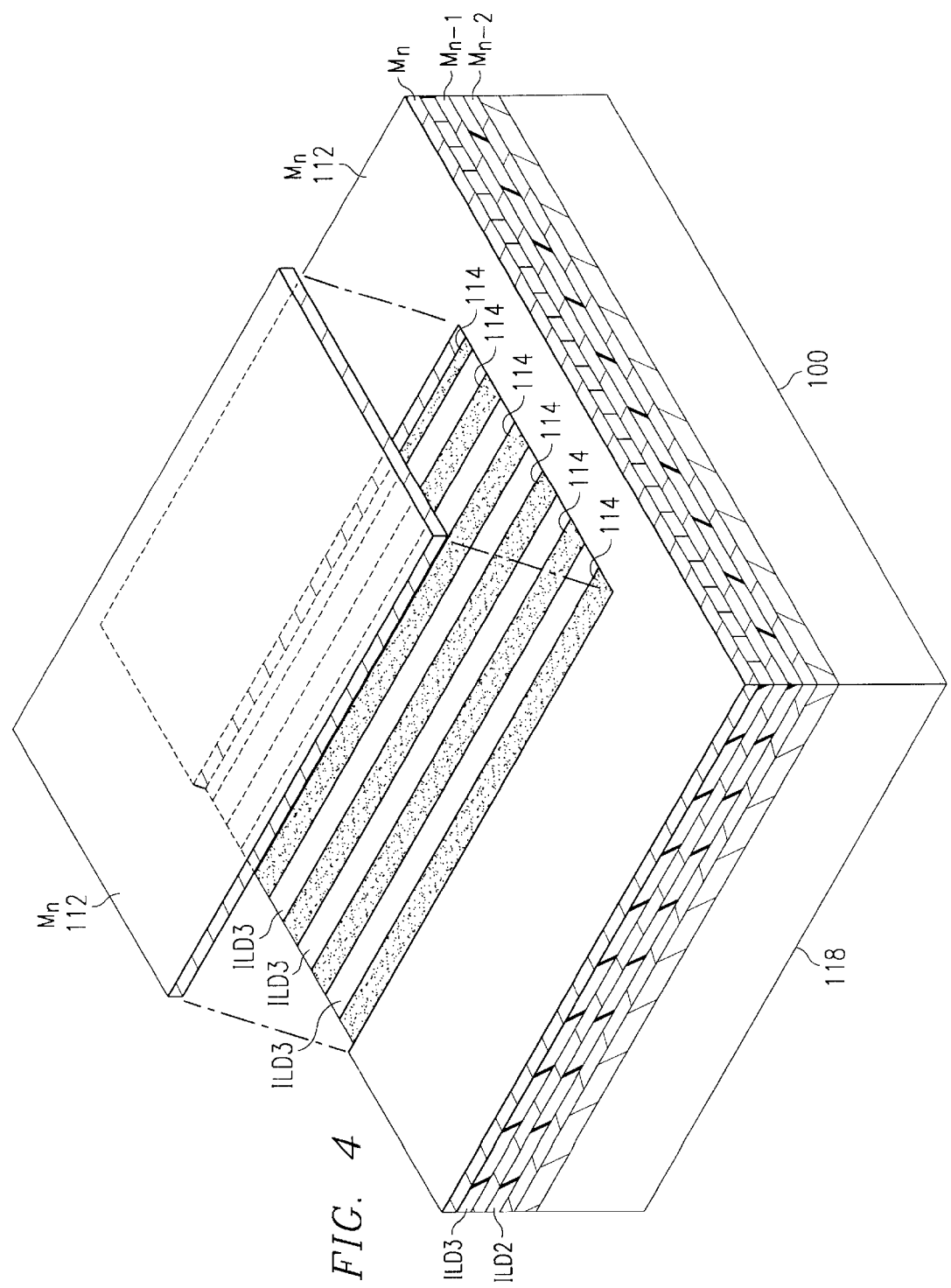
FIG. 4 is a three dimensional view of a first preferred embodiment of the invention.

A three-dimensional view of a first preferred embodiment of the invention is shown in FIG. 4. FIG. 4 shows a portion of the bond pad 112 cut away to reveal the conductive via structure 110 pattern. The first preferred embodiment of the invention uses a plurality of rails 114 extending in a direction parallel to probing. The width and spacing of rails 114 may vary by technology node and may be as small as the minimum design rules. For a 0.5 μm pitch technology, the width of rails 114 may be approximately 0.25 μm and the spacing between rails may be approximately 0.25 μm.

Figure 5:
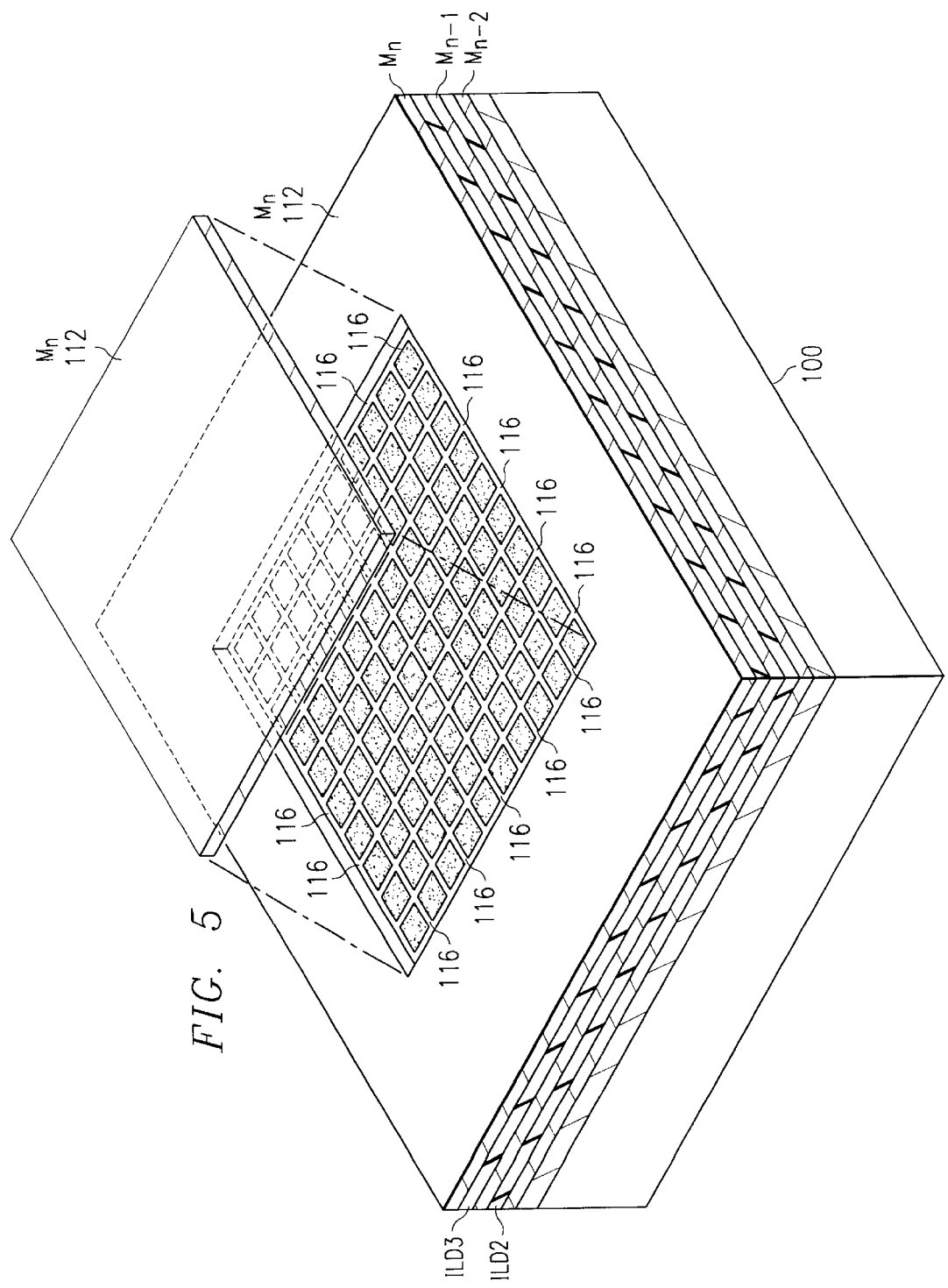
FIG. 5 is a three dimensional view of a second preferred embodiment of the invention.

A three-dimensional view of a second preferred embodiment of the invention is shown in FIG. 5. FIG. 5 shows a portion of the pad 112 cut away to reveal the conductive via structure 110 pattern. The second preferred embodiment of the invention uses a grid 116 of intersecting or cross-hatched rails.

In both the preferred embodiments of the invention, a pad 118 of metal is located in metal layer $M_{n-1}$ directly under the pad 112. The conductive via structures connected between pad 118 and pad 112. In the preferred embodiment, pad 118 is the same size as pad 112.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, other via patterns within the ILD, such as a honeycomb structure, may alternatively be used. It is therefore intended that the appended claims encompass any such modifications or embodiments.

What is claimed is:

1. An integrated circuit comprising:
   a bondpad located at a top metal interconnect level;
   a metal pad located below said bondpad in an underlying metal interconnect level;
   a dielectric layer located between the top metal interconnect level and the underlying metal interconnect level; and
   a conductive via structure shaped into a grid of cross-hatched rails, said conductive via structure extending from said bondpad to said metal pad.

2. The integrated circuit of claim 1, wherein said bondpad and said metal pad comprise copper.

3. The integrated circuit of claim 1, wherein said bondpad is a probe pad.

4. An integrated circuit comprising:
   a bondpad located at a top metal interconnect level;
   a metal pad located below said bondpad in an underlying metal interconnect level;
   a dielectric layer located between the top metal interconnect level and the underlying metal interconnect level; and a conductive via structure comprising a plurality of parallel rails extending in a lateral direction, said conductive via structure extending vertically from said bondpad to said metal pad to structurally reinforce said dielectric layer under said bondpad.

5. The integrated circuit of claim 4, wherein said bondpad and said metal pad comprise copper.

6. The integrated circuit of claim 4, wherein said bondpad is a probe pad.

7. An integrated circuit comprising:

a bondpad located at a top metal interconnect level;

a metal pad located below said bondpad in an underlying metal interconnect level;

a dielectric layer located between the top metal interconnect level and the underlying metal interconnect level; and a conductive via structure extending vertically from said bondpad to said metal pad, said conductive via structure extending laterally to structurally reinforce a portion of said dielectric layer under said bondpad.

8. The integrated circuit of claim 7, wherein said bondpad and said metal pad comprise copper.

9. The integrated circuit of claim 7, wherein said bondpad is a probe pad.

* * * * *